United States Patent [19]

Kishida et al.

[11] Patent Number: 4,714,086

[45] Date of Patent: Dec. 22, 1987

[54] APPARATUS FOR WASHING AND DRYING SUBSTRATES

[75] Inventors: Yoshifumi Kishida, Nara; Masayoshi Takeuchi, Akishima, both of Japan

[73] Assignees: Sharp Corporation; Dainichi Shoji Co., Ltd., both of Japan

[21] Appl. No.: 911,427

[22] Filed: Sep. 25, 1986

Related U.S. Application Data

[62] Division of Ser. No. 724,029, Apr. 17, 1985, Pat. No. 4,643,774.

[30] Foreign Application Priority Data

Apr. 19, 1984 [JP] Japan ................................. 59-077516

[51] Int. Cl.$^4$ ................................................. B08B 3/10
[52] U.S. Cl. ....................................... 134/83; 134/95; 134/135; 134/157
[58] Field of Search ................... 134/1, 32, 82, 83, 95, 134/99, 135, 140, 157, 161, 165, 184, 185, 14, 21, 30, 37, 25.1, 25.4; 15/301, 316 R; 34/164

[56] References Cited

U.S. PATENT DOCUMENTS

| | | | |
|---|---|---|---|
| 2,959,178 | 11/1960 | Rowan | 134/165 X |
| 2,972,352 | 2/1961 | Ipsen | 134/83 X |
| 3,295,492 | 1/1967 | Schink | 34/164 X |
| 3,893,869 | 7/1975 | Mayer et al. | 134/184 X |
| 4,318,749 | 3/1982 | Mayer | 134/37 X |
| 4,471,792 | 9/1984 | Koblenzer | 134/83 |
| 4,606,398 | 8/1986 | Prikhodko et al. | 134/1 X |

FOREIGN PATENT DOCUMENTS 128834  10/1980  Japan ..................................... 134/1

Primary Examiner—Philip R. Coe
Attorney, Agent, or Firm—Steinberg & Raskin

[57] ABSTRACT

A method for washing and drying a substrate and an apparatus therefor are disclosed which are capable of effectively rapidly carrying out the washing and drying of a semiconductor substrate in good yields without damaging and contaminating the substrate. The method comprises the steps of immersing a carrier carrying at least one substrate thereon into wash liquid; drawing up the carrier from the wash liquid while oscillating the substrate; and feeding drying gas to the substrate during the drawing-up of the carrier to remove the wash liquid from the surface of the substrate. The apparatus of the invention is constructed to allow the method to be effectively practiced.

7 Claims, 6 Drawing Figures

FIG. 4
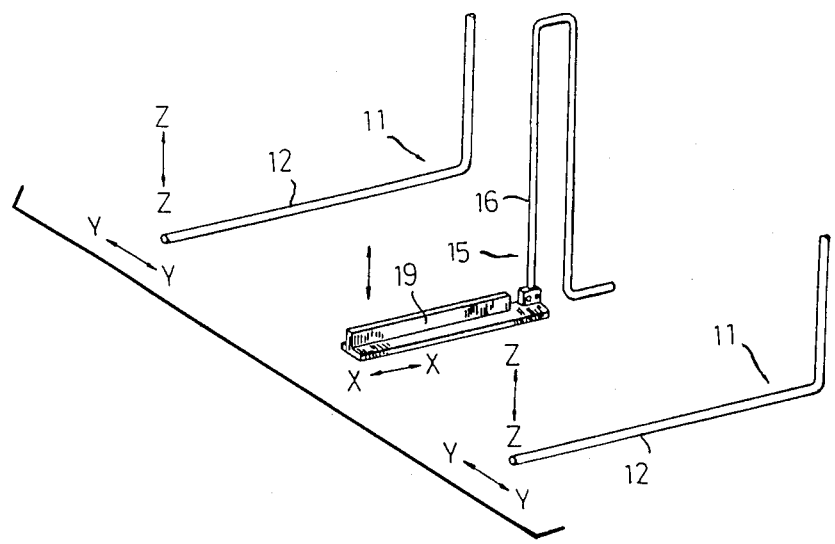
FIG. 5
FIG. 6
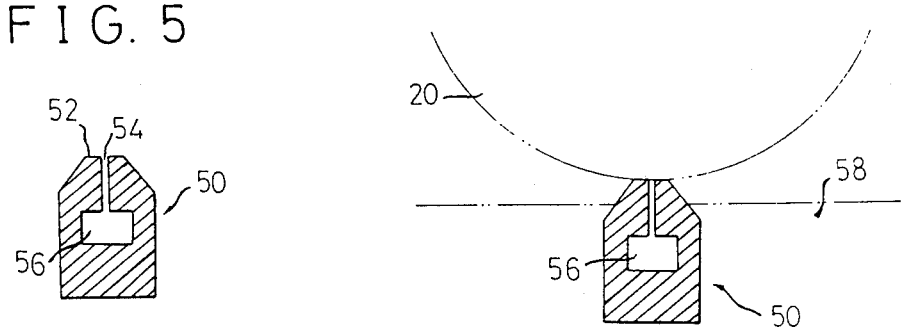

APPARATUS FOR WASHING AND DRYING SUBSTRATES

This is a division, of application Ser. No. 724,029, filed 4/17/85, now U.S. Pat. No. 4,643,774, issued Feb. 17. 1987.

BACKGROUND OF THE INVENTION

1. Field of the Invention

This invention relates to a method for washing and drying a substrate and an apparatus therefor, and more particularly to a method for washing and drying a substrate used for the production of a semiconductor device such as, for example, a silicon wafer, glass mask or the like and an apparatus suitable for practicing such a method.

2. Description of the Prior Art

Conventionally, the washing and drying of a semiconductor wafer which has been subjected to processing and a chemical treatment is carried out in a manner to put the semiconductor wafer carried on a carrier or retainer in a high speed rotating unit to wash the semiconductor wafer and dry it utilizing centrifugal force generated by the rotating unit. However, such a conventional method unfortunately causes the generation of dust from a revolving shaft of the rotating unit, which adheres to the semiconductor wafer during the rotation of the unit. The conventional method has another problem that semiconductor wafers adjacent to each other are contacted therebetween during the rotation of the unit to cause chipping of the semiconductor wafers. Further, such chipping leads to the contamination of adjacent semiconductor wafers due to adhesion of the chips thereto. Thus, it will be noted that the conventional method has an important disadvantage of failing to carry out the washing and drying of a semiconductor wafer in good yields. Accordingly, it would be highly desirable to provide a method for rapidly carrying out the washing and drying of a substrate in good yields while keeping the substrate clean during the operation.

SUMMARY OF THE INVENTION

The present invention has been made in view of the foregoing disadvantage of the prior art.

Accordingly, it is an object of the present invention to provide a method of washing and drying a substrate which is capable of rapidly drying a substrate for a short period of time as well as positively removing wash liquid adhering to the substrate therfrom.

It is another object of the present invention to provide a method for washing and drying a substrate which is capable of effectively preventing damage of substrates due to the contact therebetween during the washing and drying operation, to thereby accomplish the operation in good yields.

It is a further object of the present invention to provide an apparatus for washing and drying a substrate which is capable of positively removing wash liquid from the substrate and effectively preventing the generation of dust and the chipping of the substrate during the washing and drying operation, to thereby accomplish the operation in high yields.

In accordance with one aspect of the present invention, there is provided a method for washing and drying a substrate comprising the steps of immersing a carrier carrying at least one substrate thereon into wash liquid; drawing up the carrier from the wash liquid while oscillating the substrate; and feeding drying gas to the substrate during the drawing-up of the carrier to remove the wash liquid from the surface of the substrate.

In a preferred embodiment of the present invention, the carrier is drawn up at a speed of 1.5–4.2 cm/min.

In accordance with another aspect of the present invention, there is provided an apparatus for washing and drying a substrate comprising a movable base arranged to the vertically movable along guide means; a carrier for receiving at least one substrate therein; clamping means arranged on the movable base to clamp the carrier; oscillating means arranged on the movable base to oscillate the substrate; a wash liquid vessel in which the carrier is immersed; and means for feeding drying gas to the substrate received in the carrier during the drawing-up of the carrier from the vessel while being oscillated.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein:

FIG. 4 is an exploded perspective view showing clamping means and oscillating means used in the apparatus shown in FIG. 1;

FIG. 5 is a sectional view showing a modification of a plate member constituting a part of oscillating means in the apparatus shown in FIG. 1; and FIG. 6 is a schematic sectional view showing a state of drying the plate member shown in FIG. 5 while contacting it with a semiconductor substrate.

DETAILED DESCRIPTION OF THE PREFERRED EMBODIMENTS

Now, the present invention will be described hereinafter with reference to the accompanying drawings.

Figure 1:
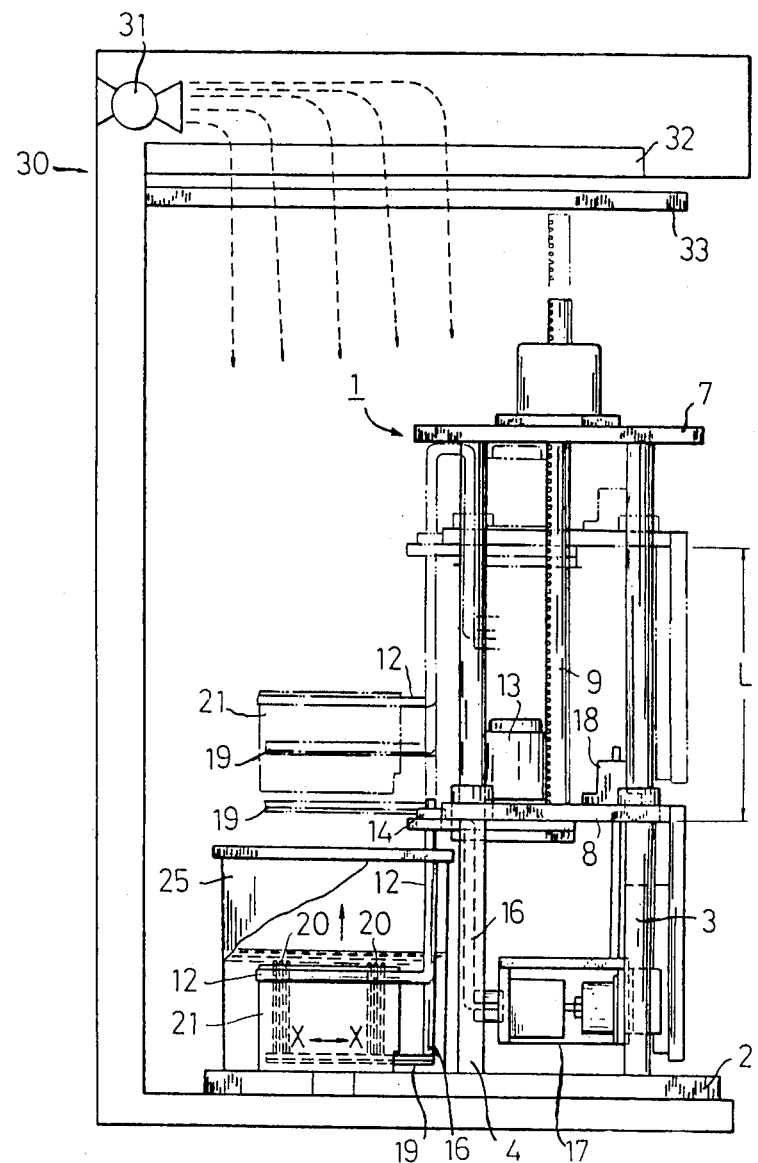
FIG. 1 is a side elevation view showing one example of the manner of use of an apparatus for washing and drying a substrate according to the present invention and an embodiment of an apparatus according to the present invention.
Figure 2:
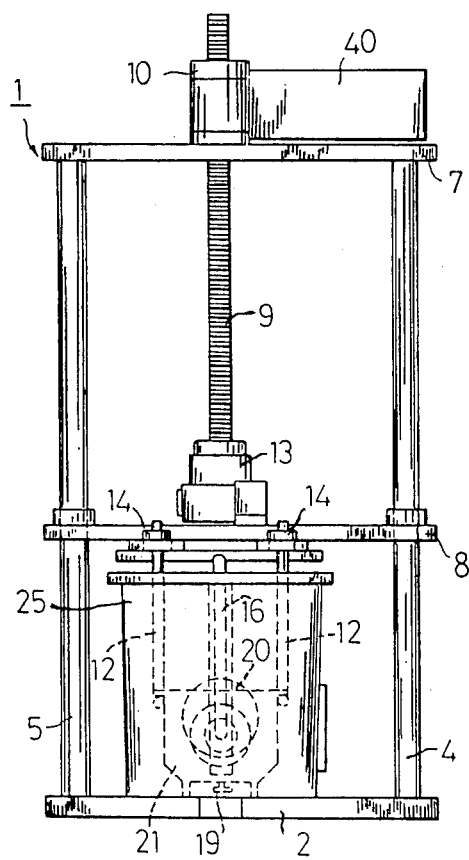
FIG. 2 is a front elevation view showing the essential part of the apparatus shown in FIG. 1.
Figure 3:
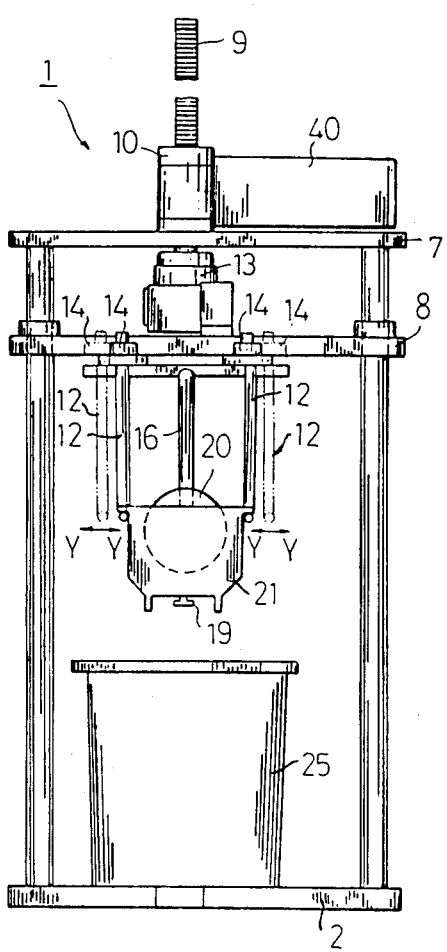
FIG. 3 is a front elevation view of the apparatus shown in FIG. 1 wherein an intermediate movable base is upward moved.

FIGS. 1 to 3 shows an embodiment of an apparatus for washing and drying a substrate according to the present invention wherein an apparatus of the present invention is generally designated by reference numeral 1. The apparatus 1 of the illustrated embodiment includes a lower fixed base 2, four studs 3, 4 and 5 (the other one being not shown) each fixed at the lower end thereof on the lower fixed base 2 and upward extending therefrom, and an upper fixed base 7 fixedly supported on the upper ends of the studs. The apparatus 1 of the illustrated embodiment also includes an intermediate movable base 8 arranged between the lower fixed base 2 and the upper fixed base 7 so as to be vertically moved along the studs by a predetermined distance L.

The intermediate movable base 8 is provided on the central portion thereof with a rack 9 of a round bar shape, which upward extends therefrom. The rack 9 is operatedly engaged with a pinion 10 driven by a motor 40 disposed on the upper base 7 to vertically move the intermediate movable base 8. The intermediate movable base 8 is provided on the front side portion thereof with clamping means 11 and oscillating means 15 which are constructed in such a manner as shown in FIG. 4. The clamping means 11 is adapted to move or transfer a carrier 21 while clamping the carrier 21 which serves to carry at least one semiconductor substrate 20 thereon, and the oscillating means 15 is adapted to somewhat oscillate the semiconductor substrate 20 in the X—X direction and the Z—Z direction, as shown in FIG. 4. In the illustrated embodiment, the carrier received a plurality of the substrates 20 therein.

The clamping means 11 comprises a pair of L-shaped clamping rods 12 (FIG. 4) adapted to clamp the carrier 21 between the distal ends thereof, an actuator or actuating unit 13 for openably actuating the clamping rods 12 and a pair of mounting plates 14 by which the upper ends of the clamping rods 12 are securely supported.

In the clamping means 11 constructed as described above, the mounting plates 14 are moved in the Y—Y direction by the actuating unit 13 to selectively adjust the interval between a pair of the clamping rods 12 as desired, so that the interval therebetween may be varied depending upon the carrier 21 used.

The oscillating means 15, as shown in FIGS. 1 and 4. comprises an oscillating rod 16 arranged at an intermediate position between the clamping rods 12 and 12 so as to be horizontal therewith, a first driving unit 17 for applying oscillating force to the oscillating rod 16 in the X—X direction in FIG. 1 and a second driving unit 18 for moving the oscillating rod 16 in the Z—Z direction. In the illustrated embodiment, the oscillating rod 16 is bent into substantially an inverted U-shape and has a plate member 19 of an inverted T-shape in section mounted on the free end thereof.

The oscillating means 15 constructed as described above is operated in a manner such that the second driving unit 18 is actuated to abut the plate member 19 of the oscillating rod 16 against the lower end of the semiconductor substrate 20 carried on or received in the carrier 21 clamped between the clamping rods 12 and 12, and then the first driving unit 17 is actuated to oscillate the oscillating rod 16 in the X—X direction, to thereby allow the carrier 21 to be somewhat oscillated in the X—X direction.

In FIG. 1, reference numerals 30, 31, 32 and 33 designate a means for feeding drying gas such as clean dried air, a blower, a filter and a heater, respectively.

Now, the manner of operation of the apparatus of the illustrated embodiment as described above will be described hereinafter with reference to FIGS. 1 to 3.

First, the intermediate movable base 8 of the apparatus 1 is positioned at the position shown in FIG. 3 and the actuating unit or actuator 13 is actuated to adjust the interval between the clamping rods 12 and 12 depending upon the width of the carrier 21 used, as shown in FIG. 3. Then, the clamping rods 12 are actuated to clamp the carrier 21 therebetween through flanges formed at the upper edges of both side walls of the carrier 21 and then the second driving unit 18 is actuated to move the oscillating means 15 in the Z—Z direction, to thereby abut the plate member 19 against the lower end of each of the semiconductor substrates 20. Thereafter, the motor 40 mounted on the upper fixed base 7 is driven to lower the carrier 21 into a wash liquid vessel 25 to fully immerse the substrate 20 in wash or cleaning liquid. Subsequently, the plate number 19 abutted against each of the semiconductor substrates 20 is oscillated, for example, in a manner such that it is reciprocated at a distance of 2 mm every two seconds, to thereby cause the each of semiconductor substrates 20 to be somewhat reciprocated in the X—X direction. Then, the carrier 21 is drawn up from the wash or cleaning liquid at a speed as low as about 1 cm/min. while providing the semiconductor substrates 20 with such movement and concurrently the semiconductor substrates are exposed to a stream of drying gas such as air during the drawing-up of the carrier to remove the wash liquid therefrom. The washing and drying operation is completed when the carrier is returned to the position shown in FIG. 3. The wash liquid collected between the carrier 21 and the semiconductor substrates 20 is effectively removed due to the drop from the carrier 21 during the oscillation of the semiconductor substrates 20 at a low speed in the X—X direction.

FIG. 5 illustrates a modification of the plate member constituting a part of the oscillating means 15. A plate member of the illustrated modification generally designated by reference numeral 50 has a groove 54 formed on the surface 52 thereof contacted with semiconductor substrates so as to extend in the longitudinal direction thereof. The groove 54 is formed to be communicated with a cavity 56 formed in the interior of the plate member 50.

The plate member 50 constructed above is used in such a manner as shown in FIG. 6. More particularly, the plate member 50 is kept contacted at the upper surface thereof with the lower surface of each of semiconductor substrates 20 during the washing and drying operation. After the washing operation, when the semiconductor substrates are drawn up from wash or cleaning liquid 58 while oscillating the plate member 50, wash liquid remaining on the lower surface of the substrate 20 is sucked through the groove 54 into the cavity 56 due to capillary phenomenon. Thus, it will be noted that the plate member substantially promotes the drying of the washed semiconductor substrates 20.

As can be seen from the foregoing, the present invention is capable of rapidly drying semiconductor substrates for a short period of time because it allows the surface tension of wash liquid to be available for the drying. Also, the present invention effectively prevent the generation of any dust during the washing and drying operation, so that semiconductor substrates are kept clean. Further, the present invention positively prevents the chipping of semiconductor substrates to carry out the washing and drying of the semiconductors in high yields, thus, a semiconductor device such as an integrated circuit and the like are kept at a high quality.

It will thus be seen that the objects set forth above, and those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

What is claimed is:

1. An apparatus for washing and drying a substrate comprising:
   a movable base;
   stud means along which said base is arranged to be substantially vertically movable;
   a carrier for receiving at least one substrate therein;

clamping means arranged on said movable base for clamping said carrier;

oscillating means arranged on said movable base for oscillating the substrate;

a wash liquid vessel for immersing said carrier therewithin; and means for feeding drying gas to the substrate received in said carrier during drawing-up of said carrier from said vessel while being oscillated.

2. An apparatus as defined in claim 1, wherein said oscillating means comprise a plate member provided to contact a bottom of the substrate received in said carrier, a connecting member connected to said plate member, and a driving unit for applying oscillating force to said connecting member.

3. An apparatus as defined in claim 2, additionally comprisifng a groove provided on a surface of said plate member for contacting the substrate, said groove extending in a substantially longitudinal direction of said plate member, and a cavity provided in an interior of said plate member and communicating with said groove.

4. The apparatus of claim 2, wherein said connecting member is substantially in the shape of an inverted U, and said plate member is substantially in the shape of an inverted U, and said plate member is substantially in the shape of an inverted T mounted on a free end of said connecting member.

5. The apparatus of claim 1, additionally comprising a lower fixed base, said stud means comprising at least three studs, each fixed on said lower fixed supported on upper ends of said studs, with said movable base arranged between said lower fixed base and said upper fixed base to be substantially vertically movable along sai studs.

6. The apparatus of claim 5, additionally comprising a rack mounted upon said movable base and extending upwardly therefrom, a pinion disposed upon said upper fixed base and engaged with said rack, and a motor disposed upon said upper fixed base, for driving said pinion.

7. The apparatus of claim 1, wherein said clamping means comprise a pair of substantially L-shaped rods for clamping said carrier between distal ends thereof.

* * * * *